(12) United States Patent
Chen et al.

(10) Patent No.: US 10,504,852 B1
(45) Date of Patent: Dec. 10, 2019

(54) THREE-DIMENSIONAL INTEGRATED CIRCUIT STRUCTURES

(71) Applicant: Taiwan Semiconductor Manufacturing Co., Ltd., Hsinchu (TW)

(72) Inventors: Jie Chen, New Taipei (TW); Hsien-Wei Chen, Hsinchu (TW); Ying-Ju Chen, Yunlin County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/016,658

(22) Filed: Jun. 25, 2018

(51) Int. Cl.
*H01L 23/544* (2006.01)
*H01L 23/522* (2006.01)
*H01L 25/065* (2006.01)
*H01L 23/528* (2006.01)

(52) U.S. Cl.
CPC .......... *H01L 23/544* (2013.01); *H01L 23/528* (2013.01); *H01L 23/5226* (2013.01); *H01L 25/0657* (2013.01); *H01L 2223/54426* (2013.01); *H01L 2225/06524* (2013.01); *H01L 2225/06544* (2013.01); *H01L 2225/1041* (2013.01)

(58) Field of Classification Search
CPC ... H01L 23/544; H01L 23/528; H01L 23/522; H01L 25/0657; H01L 2225/06544; H01L 2225/1041
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2009/0206411 A1* | 8/2009 | Koketsu | H01L 23/544 257/368 |
| 2017/0141052 A1* | 5/2017 | Pan | H01L 21/563 |

* cited by examiner

*Primary Examiner* — Dung A. Le
(74) *Attorney, Agent, or Firm* — JCIPRNET

(57) ABSTRACT

Three-dimensional integrated circuit (3DIC) structures are disclosed. A 3DIC structure includes a first die and a second die bonded to the first die. The first die includes a first integrated circuit region and a first seal ring region around the first integrated circuit region, and has a first alignment mark within the first integrated circuit region. The second die includes a second integrated circuit region and a second seal ring region around the second integrated circuit region, and has a second alignment mark within the second seal ring region and corresponding to the first alignment mark.

19 Claims, 16 Drawing Sheets

THREE-DIMENSIONAL INTEGRATED CIRCUIT STRUCTURES

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

DETAILED DESCRIPTION

Figure 1:
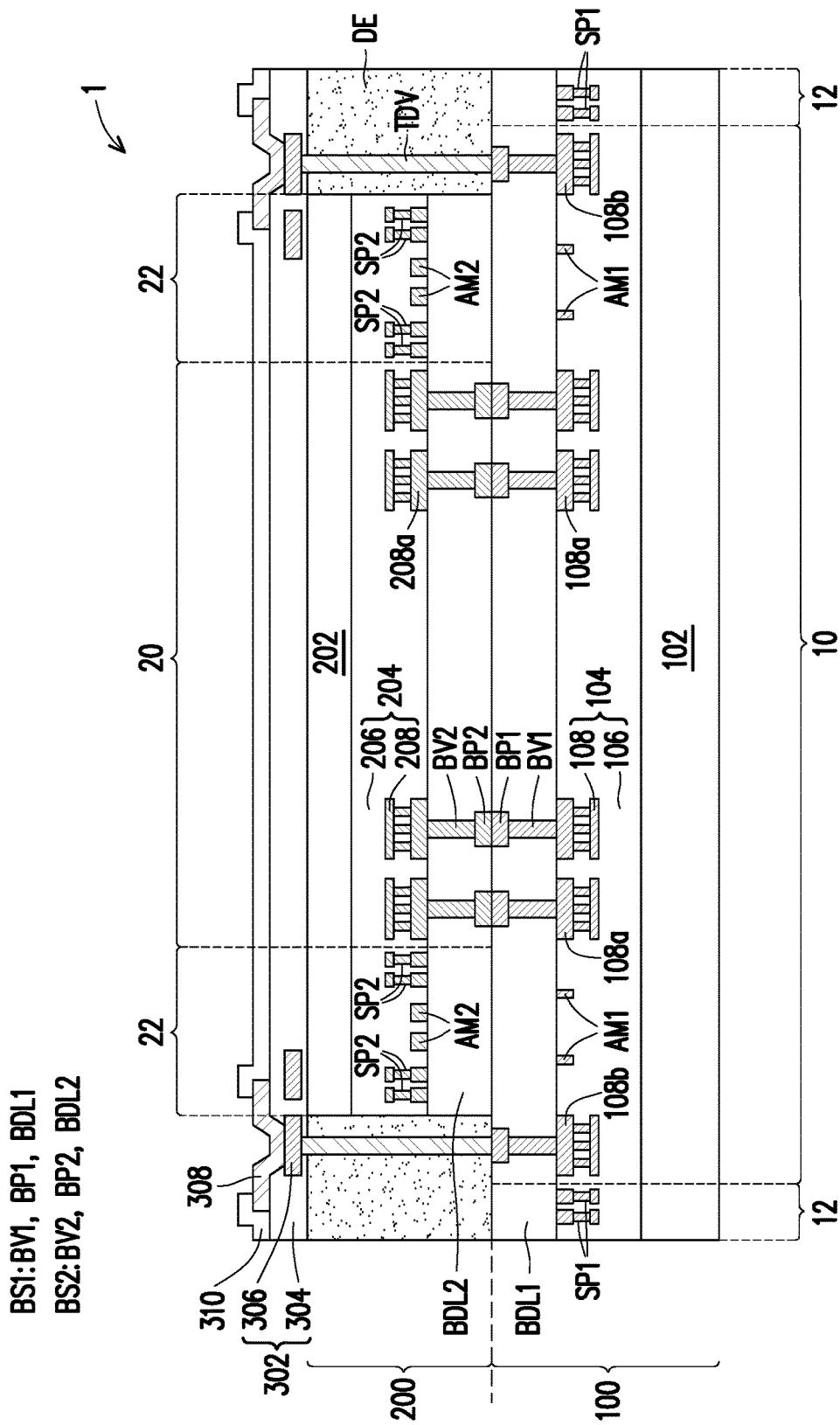
FIG. 1 is a cross-sectional view of a 3DIC structure in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
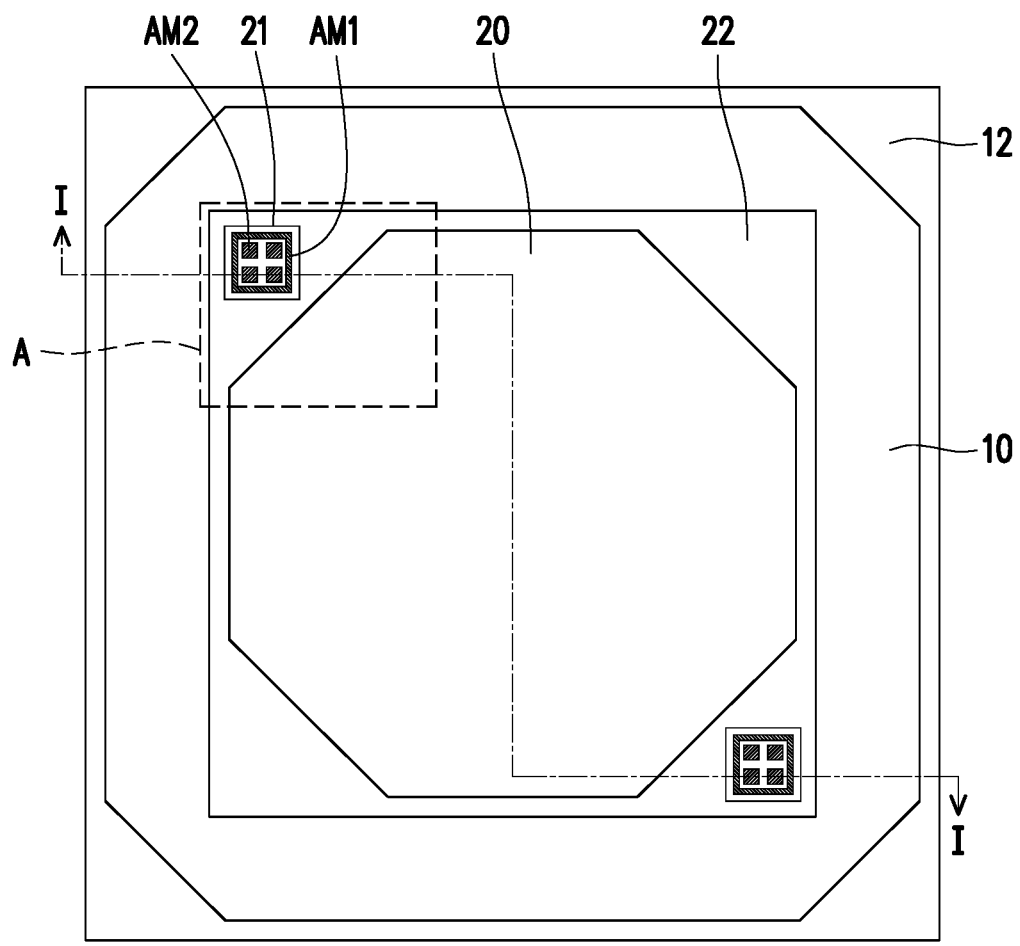
FIG. 2 is a simplified top view of a 3DIC structure in accordance with some embodiments.
Figure 3:
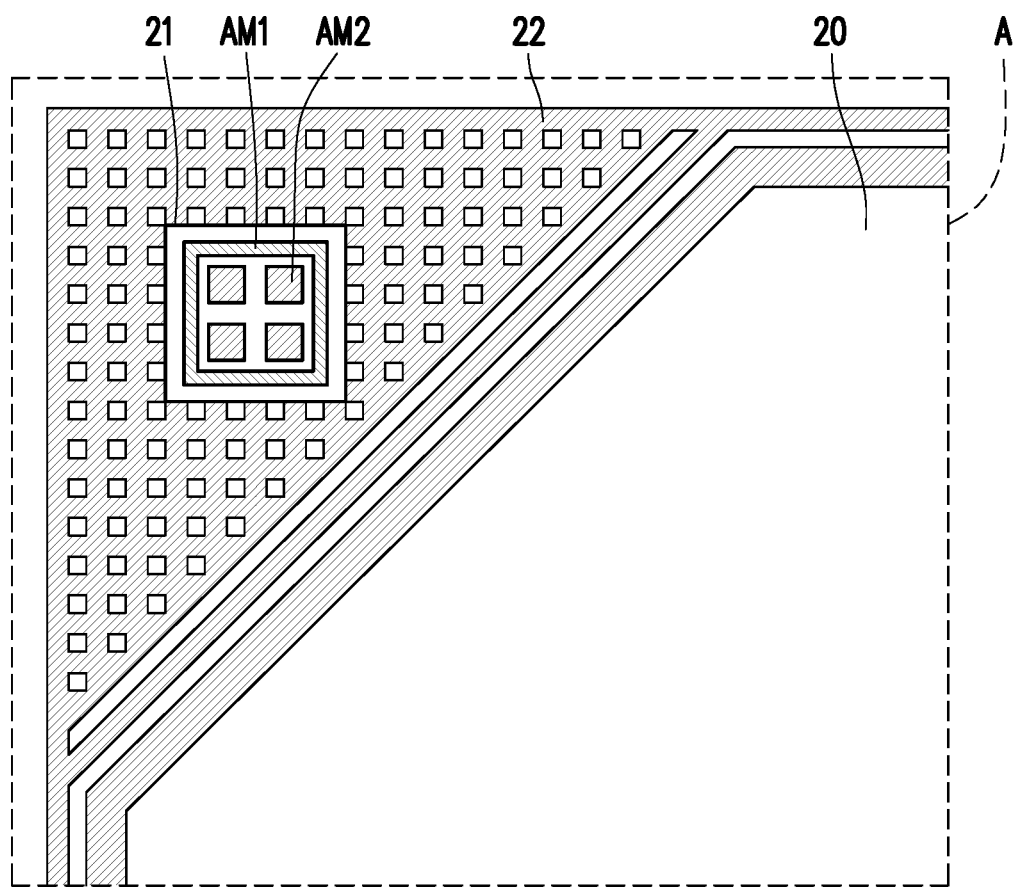
FIG. 3 is an enlarged top view of the part A of FIG. 2.

FIG. 1 is a cross-sectional view of a 3DIC structure in accordance with some embodiments. FIG. 2 is a simplified top view of a 3DIC structure in accordance with some embodiments. Specifically, FIG. 1 is a cross-sectional view taken along the line I-I of FIG. 2. For simplicity and clarity of illustration, only few elements such as first and second dies and first and second alignment marks are shown in the simplified top view of FIG. 2, and these elements are not necessarily in the same plane. FIG. 3 is an enlarged top view of the part A of FIG. 2.

Referring to FIG. 1, a first die 100 is provided. The first die 100 may be an application-specific integrated circuit (ASIC) chip, an analog chip, a sensor chip, a wireless and radio frequency chip, a voltage regulator chip or a memory chip, for example. In some embodiments, the first die 100 may be an active component or a passive component. In some embodiments, the first die 100 includes a first semiconductor substrate 102, a first interconnect structure 104, a plurality of first seal ring patterns SP1, a first alignment mark AM1 and a first bonding structure BS1.

In some embodiments, the first semiconductor substrate 102 includes an elementary semiconductor such as silicon or germanium and/or a compound semiconductor such as silicon germanium, silicon carbide, gallium arsenic, indium arsenide, gallium nitride or indium phosphide. In some embodiments, the first semiconductor substrate 102 is a semiconductor-on-insulator (SOI) substrate. In various embodiments, the first semiconductor substrate 102 may take the form of a planar substrate, a substrate with multiple fins, nanowires, or other forms known to people having ordinary skill in the art. Depending on the requirements of design, the first semiconductor substrate 102 may be a P-type substrate or an N-type substrate and may have doped regions therein. The doped regions may be configured for an N-type device or a P-type device.

In some embodiments, the first semiconductor substrate 102 includes a first integrated circuit region 10 and a first seal ring region 12 around or surrounding the first integrated circuit region 10. The first integrated circuit region 10 and the first seal ring region 12 constitute a first die region or chip region of the first die 100.

In some embodiments, the first semiconductor substrate 102 includes isolation structures defining at least one active area, and a first device layer is disposed on/in the active area. The first device layer includes a variety of devices. In some embodiments, the devices include active components, passive components, or a combination thereof. In some embodiments, the devices may include integrated circuits devices. The devices are, for example, transistors, capacitors, resistors, diodes, photodiodes, fuse devices, or other similar devices. In some embodiments, the first device layer includes a gate structure, source/drain regions, spacers, and the like.

The first interconnect structure 104 is disposed over a first side (e.g., front side) of the first semiconductor substrate 102. Specifically, the first interconnect structure 104 is disposed over and electrically connected to the first device layer within the first integrated circuit region 10. In some embodiments, the first interconnect structure 104 includes at least one first insulating layer 106 and a plurality of first metal features 108. The first metal features 108 are disposed in the first insulating layer 106 and electrically connected with each other. A portion of the first metal features 108, such as first top metal features 108a and 108b, are exposed by the first insulating layer 106. In some embodiments, the first insulating layer 106 includes an inter-layer dielectric (ILD) layer on the first semiconductor substrate 102, and at least one inter-metal dielectric (IMD) layer over the inter-layer dielectric layer. In some embodiments, the first insulating layer 106 includes silicon oxide, silicon oxynitride, silicon nitride, a low dielectric constant (low-k) material or a combination thereof. The first insulating layer 106 may be a single layer or a multiple-layer structure. In some embodiments, the first metal features 108 include plugs and metal lines. The plugs may include contacts formed in the inter-layer dielectric layer, and vias formed in the inter-metal dielectric layer. The contacts are formed between and in contact with a bottom metal line and the underlying first device layer. The vias are formed between and in contact with two metal lines. The first metal features 108 may include tungsten (W), copper (Cu), a copper alloy, aluminum (Al), an aluminum alloy or a combination thereof. In some embodiments, a barrier layer may be disposed between the first metal features 108 and the first insulating layer 106 to prevent the material of the first metal features 108 from migrating to the underlying first device layer. The barrier layer includes Ta, TaN, Ti, TiN, CoW or a combination thereof, for example. In some embodiments, the first interconnect structure 104 is formed by a dual damascene process. In alternative embodiments, the first interconnect structure 104 is formed by multiple single damascene processes. In yet alternative embodiments, the first interconnect structure 104 is formed by an electroplating process.

The first seal ring patterns SP1 are disposed over the first side (e.g., front side) of the first semiconductor substrate 102. Specifically, the first seal ring patterns SP1 are disposed over and electrically insulated from the first device layer, and located aside the first interconnect structure 104 within the first seal ring region 12. In some embodiments, the first seal ring patterns SP1 have a grid-like shape, a strip shaped, a ring shape or any suitable shape. In some embodiments, the first interconnect structure 104 is arranged to form the first seal ring patterns SP1. That is, the first seal ring patterns SP1 are formed during the formation of the first interconnect structure 104.

Herein, when elements are described as "at substantially the same level", the elements are formed at substantially the same height in the same layer, or having the same positions embedded by the same layer. In some embodiments, the elements at substantially the same level are formed from the same material(s) with the same process step(s). In some embodiments, the tops of the elements at substantially the same level are substantially coplanar. For example, as shown in FIG. 1, the first seal ring patterns SP1 are at substantially the same level with the first interconnect structure 104. Specifically, the top surfaces of the first seal ring patterns SP1 are substantially coplanar with the top surfaces of the first top metal features 108a and 108b of the first interconnect structure 104.

The first alignment mark AM1 is disposed over the first side (e.g., front side) of the first semiconductor substrate 102. Specifically, the first alignment mark AM1 is disposed over and electrically insulated from the first device layer, and located between the first top metal features 108a and 108b of the first interconnect structure 104 within the first integrated circuit region 10. In some embodiments, the first alignment mark AM1 is at a floating potential. In some embodiments, the first interconnect structure 104 is arranged to form the first alignment mark AM1. Specifically, the first alignment mark AM1 is formed during the formation of the first top metal features 108a and 108b of the first interconnect structure 104. In some embodiments, the first alignment mark AM1 includes metal, such as copper. In some embodiments, the first alignment mark AM1 is at substantially the same level with the first top metal features 108a and 108b of the first interconnect structure 104. Specifically, as shown in FIG. 1, the top surface of the first alignment mark AM1 is substantially coplanar with the top surfaces of the first top metal features 108a and 108b of the first interconnect structure 104.

In some embodiments, the first alignment mark AM1 is square, rectangular, polygonal, round, elliptical, strip-shaped, T-shaped, L-shaped, box-shaped, cross-shaped or any suitable shape. For example, the first alignment mark AM1 is designed as a square box or square pattern, as shown in FIG. 2 and FIG. 3.

In some embodiments, an alignment mark is detected using an imaging device mounted on an exposing apparatus, before the exposing process of a resist layer for defining patterns is carried out. In some embodiments, the alignment mark can be referred to an overlay mark. Specifically, when two layers, elements or dies are bonded with one another, the alignment marks of the two layers, elements or dies can be inspected for overlay accuracy based on whether the upper alignment mark and the lower alignment mark are accurately aligned with each other. Therefore, the alignment mark can function as an overlay mark. In some embodiments, the first alignment mark AM1 is referred to as a first overlay mark throughout the specification.

Figure 4:
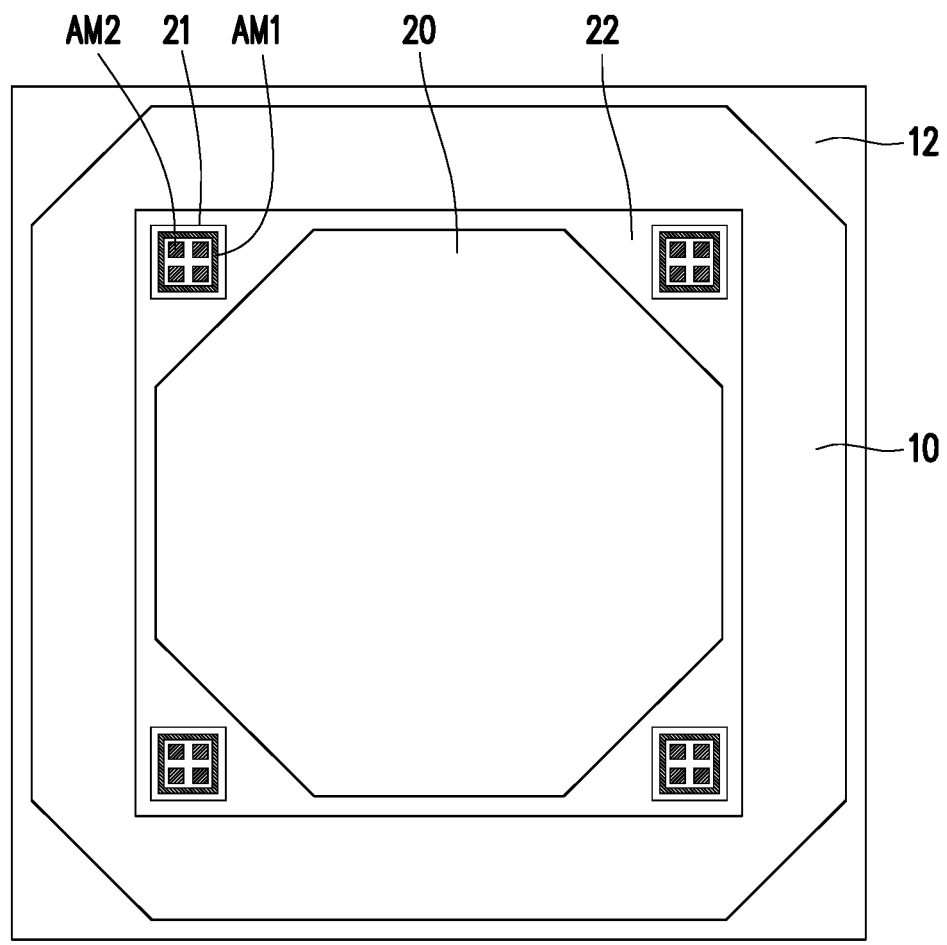
FIG. 4 is a simplified top view of a 3DIC structure in accordance with some embodiments.

In some embodiments, multiple first alignment marks AM1 are disposed in the first integrated circuit region 10. In some embodiments, two first alignment marks AM1 are disposed in the diagonal corners of the first integrated circuit region 10, as shown in FIG. 2. In alternative embodiments, four first alignment marks AM1 are disposed in the four corners of the first integrated circuit region 10, as shown in FIG. 4.

The first bonding structure BS1 is disposed over the first side (e.g., front side) of the first interconnect structure 104. Specifically, the first bonding structure BS1 is disposed over the first interconnect structure 104 within the first integrated circuit region 10. In some embodiments, the first bonding structure BS1 includes at least one first bonding dielectric layer BDL1 and a plurality of first bonding metal features. In some embodiments, the first bonding dielectric layer BDL1 includes silicon oxide, silicon nitride, a polymer or a combination thereof. The first bonding metal features are disposed in the first bonding dielectric layer BDL1 and electrically connected with each other. In some embodiments, the first bonding metal features include first bonding vias BV1 electrically connected to the first interconnect structure 104 and first bonding pads BP1 electrically connected to the first bonding vias BV1. The first bonding metal features may include tungsten (W), copper (Cu), a copper alloy, aluminum (Al), an aluminum alloy or a combination thereof. In some embodiments, a barrier layer may be disposed between the first bonding metal features and the first bonding dielectric layer BDL1. The barrier layer includes Ta, TaN, Ti, TiN, CoW or a combination thereof, for example. In some embodiments, the first bonding structure BS1 is formed by a dual damascene process. In alternative embodiments, the first bonding structure BS1 is formed by multiple single damascene processes. In yet alternative embodiments, the first bonding structure BS1 is formed by an electroplating process.

Still referring to FIG. 1, a second die 200 is provided. The second die 200 may be an application-specific integrated circuit (ASIC) chip, an analog chip, a sensor chip, a wireless and radio frequency chip, a voltage regulator chip or a memory chip, for example. The second die 200 and the first die 100 may be the same type of dies or different types of dies. In some embodiments, the second die 200 may be an active component or a passive component. In some embodiments, the second die 200 is smaller than the first die 100.

In some embodiments, the second die 200 is similar to the first die 100. Similarly, the second die 200 includes a second semiconductor substrate 202, a second interconnect structure 204, a plurality of second seal ring patterns SP2, a second alignment mark AM2 and a second bonding structure BS2. Thus, the difference between the second die 200 and the first die 100 is illustrated in details below and the similarity between them is not iterated herein.

The second semiconductor substrate 202 is similar to the first semiconductor substrate 102. Similarly, the second semiconductor substrate 202 includes a second integrated circuit region 20 and a second seal ring region 22 around or surrounding the second integrated circuit region 20. The second integrated circuit region 20 and the second seal ring region 22 constitute a first die region or chip region of the second die 200.

The second interconnect structure 204 is similar to the first interconnect structure 104. Similarly, the second interconnect structure 204 is disposed over a first side (e.g., front side) of the second semiconductor substrate 202. Specifically, the second interconnect structure 204 is disposed over and electrically connected to the second device layer within the second integrated circuit region 20. In some embodiments, the second interconnect structure 204 includes at least one second insulating layer 206 and a plurality of second metal features 208. The second metal features 208 are disposed in the second insulating layer 206 and electrically connected with each other. A portion of the second metal features 208, such as second top metal features 208a, are exposed by the second insulating layer 206.

The second bonding structure BS2 is similar to the first bonding structure BS1. Similarly, the second bonding structure BS2 is disposed over the first side (e.g., front side) of the second interconnect structure 204. Specifically, the second bonding structure BS2 is disposed over the second interconnect structure 204 within the second integrated circuit region 20. In some embodiments, the second bonding structure BS2 includes at least one second bonding dielectric layer BDL2 and a plurality of second bonding metal features. The second bonding metal features are disposed in the second bonding dielectric layer BDL2 and electrically connected with each other. In some embodiments, the second bonding metal features include second bonding vias BV2 electrically connected to the second interconnect structure 204 and second bonding pads BP2 electrically connected to the second bonding vias BV2.

The second seal ring patterns SP2 are similar to the first seal ring patterns SP1. Similarly, the second seal ring patterns SP2 are disposed over the first side (e.g., front side) of the second semiconductor substrate 202. Specifically, the second seal ring patterns SP2 are disposed over and electrically insulated from the second device layer, and located aside the second interconnect structure 204 within the second seal ring region 22. In some embodiments, the second seal ring patterns SP2 have a grid-like shape, a strip shaped, a ring shape or any suitable shape. In some embodiments, the second interconnect structure 204 is arranged to form the second seal ring patterns SP2. That is, the second seal ring patterns SP2 are formed during the formation of the second interconnect structure 204. As shown in FIG. 1, the second seal ring patterns SP2 are at substantially the same level with the second interconnect structure 204. Specifically, the top surfaces of the second seal ring patterns SP2 are substantially coplanar with the top surfaces of the second top metal features 208a of the second interconnect structure 204.

The second alignment mark AM2 is disposed over the first side (e.g., front side) of the second semiconductor substrate 202. Specifically, the second alignment mark AM2 is disposed over and electrically insulated from the second device layer, and located between the second seal ring patterns SP2 within the second seal ring region 22. In some embodiments, the second alignment mark AM2 is at a floating potential. In some embodiments, the second interconnect structure 204 is arranged to form the second alignment mark AM2. In some embodiments, the second alignment mark AM2 includes metal, such as copper. Specifically, the second alignment mark AM2 is formed during the formation of the second top metal features 208a of the second interconnect structure 204. In some embodiments, the second alignment mark AM2 is at substantially the same level with the second top metal features 208a of the second interconnect structure 204. Specifically, as shown in FIG. 1, the top surface of the second alignment mark AM2 is substantially coplanar with the top surfaces of the second top metal features 208a of the second interconnect structure 204.

In some embodiments, the second alignment mark AM2 is square, rectangular, polygonal, round, elliptical, strip-shaped, T-shaped, L-shaped, box-shaped, cross-shaped or any suitable shape. For example, the second alignment mark AM2 is designed as four square islands or square patterns, as shown in FIG. 2 and FIG. 3.

In some embodiments, the second alignment marks AM2 is referred to a second overlay mark through the specification. In some embodiments, multiple second alignment marks AM2 are disposed in the second seal ring region 22. In some embodiments, two second alignment marks AM2 are disposed in the diagonal corners of the second seal ring region 22, as shown in FIG. 2. In alternative embodiments, four second alignment marks AM2 are disposed in the four corners of the second seal ring region 22, as shown in FIG. 4.

One difference between the second die 200 and the first die 100 lies in the die size. In some embodiments, the size of the second die 200 is different from (e.g., less than) the size of the first die 100. Herein, the term "size" is referred to the length, width and/or area. For example, as shown in the top views of FIG. 2 and FIG. 4, the size or area of the second die 200 is less than the size or area of the first die 100.

Another difference between the second die 200 and the first die 100 lies in the positions of alignment marks. Specifically, the second alignment mark AM2 of the second die 200 is within the second seal ring region 22, while the first alignment mark AM1 of the first die 100 is within the first integrated circuit region 10.

With continuing reference to FIG. 1, the second die 200 is turned upside down and mounted onto the first die 100. In some embodiments, the second die 200 and the first die 100 are face-to-face bonded together with the first bonding structure BS1 and the second bonding structure BS2. In some embodiments, before the second die 200 is bonded to the first die 100, the second bonding structure BS2 and the first bonding structure BS1 are aligned, such that the second bonding pads BP2 are bonded to the first bonding pads BP1 and the second bonding dielectric layer BDL2 is bonded to the second bonding dielectric layer BDL2. In some embodiments, the alignment of the first bonding structure BS1 and the second bonding structure BS2 may be achieved by using an optical sensing method. After the alignment is achieved, the first bonding structure BS1 and the second bonding structure BS2 are bonded together by a hybrid bonding including a metal-to-metal bonding and a dielectric-to-dielectric bonding.

After the second die 200 is bonded to the first die 100, the second alignment mark AM2 corresponds to the first alignment mark AM1 for inspecting the overlay accuracy between the first alignment mark AM1 (or called first overlay mark) of the first die 100 and the second alignment mark AM2 (or called second overlay mark) of the second die 200. In some embodiments, overlay measurement optically measure the relative positions of the overlay marks of different dies. In some embodiments, the measurements of alignment marks are measured by an optical tool, such as an optical microscope.

It is noted that, from the top view of FIG. 2 and FIG. 3, the first alignment mark AM1 and the second alignment mark AM2 are both within a corner of the second seal ring region 22 of the second die 200. Specifically, the second die 200 includes a second integrated circuit region 20, a second seal ring region 22 around the second integrated circuit region 20, and an alignment mark region 21 within the second seal ring region 22. More specifically, the first alignment mark AM1 and the second alignment mark AM2 are both within alignment mark region 21 of the second die 200 in a top view. In some embodiments, from the top view, the first alignment mark AM1 of the first die 100 surrounds the second alignment mark AM2 of the second die 200, and the second seal ring patterns SP2 surround the first alignment mark AM1. The second seal ring patterns SP2 are separated from the first alignment mark AM1 by a distance.

Figure 5:
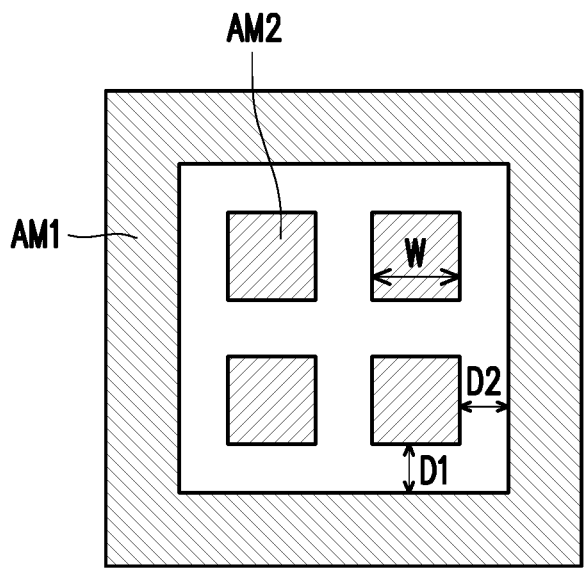
FIG. 5 to FIG. 16 are top views of alignment marks of 3DIC structures in accordance with some embodiments.

In some embodiments, the first alignment mark AM1 is designed as a square box, and the second alignment mark AM2 is designed as four square islands within the square box, as shown in FIG. 2 to FIG. 5. In some embodiments, as shown in FIG. 5, the dimension W of one square island of second alignment mark AM2 is about 2.5 µm or more, the first distance (e.g., vertical distance) D1 between one square island of second alignment mark AM2 and the square box of the first alignment mark AM1 is about 2.5 µm or more, and the second distance (e.g., horizontal distance) D2 between one square island of second alignment mark AM2 and the square box of the first alignment mark AM1 is about 2.5 µm or more.

In some embodiments, a dielectric encapsulation DE, a plurality of through dielectric vias TDV, a redistribution layer structure 302, a plurality of pads 308 and a passivation layer 310 are further included in the three-dimensional integrated circuit structure of FIG. 1.

The dielectric encapsulation DE is disposed over the first die 100 and aside the second die 200. Specifically, the dielectric encapsulation DE surrounds the sidewall of the second die 200, exposes the top of the second die 200 and overlays the first side (e.g., front side) of the first die 100. In some embodiments, the second side (e.g., back side) of the second die 200 is substantially planar with the top surface of the dielectric encapsulation DE. In some embodiments, the dielectric encapsulation DE includes a molding compound. The molding compound may include a resin and a filler. In alternative embodiments, the dielectric encapsulation DE includes silicon oxide, silicon nitride or a combination thereof. The dielectric encapsulation DE may be formed by spin-coating, lamination, deposition or the like. In some embodiments, multiple through-substrate vias (TSV) are formed through the second semiconductor substrate 202 and are electrically connected to the second interconnect structure 204.

The through dielectric vias TDV are disposed in the dielectric encapsulation DE and electrically connected with the first interconnect structure 104 and the to-be-formed redistribution layer structure 302. In some embodiments, the through dielectric vias TDV include conductive vias. The conductive vias include copper, a copper alloy, aluminum, an aluminum alloy or a combination thereof. In some embodiments, the through dielectric vias TDV further include a diffusion barrier layer between the conductive vias and the dielectric encapsulation DE. The diffusion barrier layer includes Ta, TaN, Ti, TiN, CoW or a combination thereof.

The redistribution layer structure 302 is disposed over the second side (e.g., back side) of the second die 200 and over the dielectric encapsulation DE. The redistribution layer structure 302 includes at least one dielectric layer 304 and at least one conductive layer 306 stacked alternately. In some embodiments, a portion of the redistribution layer structure 302 is electrically connected to the through dielectric vias TDV. In some embodiments, another portion of the redistribution layer structure 302 is electrically connected to the through silicon vias. In some embodiments, the dielectric layer 304 includes a photo-sensitive material such as polybenzoxazole (PBO), polyimide (PI), benzocyclobutene (BCB), a combination thereof or the like. In some embodiments, the conductive layer 306 includes copper, nickel, titanium, a combination thereof or the like.

The pads 308 are disposed over the redistribution layer structure 302. In some embodiments, the pads 308 are under bump metallization (UBM) pads for mounting conductive connectors, such as metal pillars, µ-bumps or the like. The pads 308 include a metal or a metal alloy. The pads 308 includes aluminum, copper, nickel, or an alloy thereof.

The passivation layer 310 covers the dielectric layer 304 and edge portions of the pads 308, and exposes the center portions of the pads 308. In some embodiments, the passivation layer 110 includes silicon oxide, silicon nitride, benzocyclobutene (BCB) polymer, polyimide (PI), polybenzoxazole (PBO) or a combination thereof.

The above embodiments in which the first alignment mark AM1 is designed to have a box-shaped pattern and the second alignment mark AM2 is designed to have four square patterns are provided for illustration purposes, and are not construed as limiting the present disclosure. The pattern number, pattern size and shape of each of the first alignment mark AM1 and the second alignment mark AM2 can be designed as needed. In some embodiments, from a top view, the first alignment mark AM1 includes a shape complementary of a shape of the second alignment mark AM2.

Figure 6:
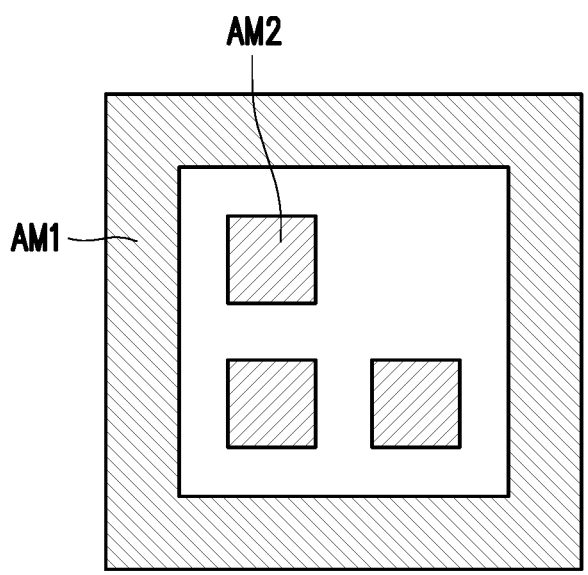

In some embodiments, as shown in FIG. 6, the first alignment mark AM1 is designed to have a box-shaped pattern, the second alignment mark AM2 is designed to have three square patterns, and the square patterns of the second alignment mark AM2 are within the box-shaped pattern of the first alignment mark AM1.

Figure 7:
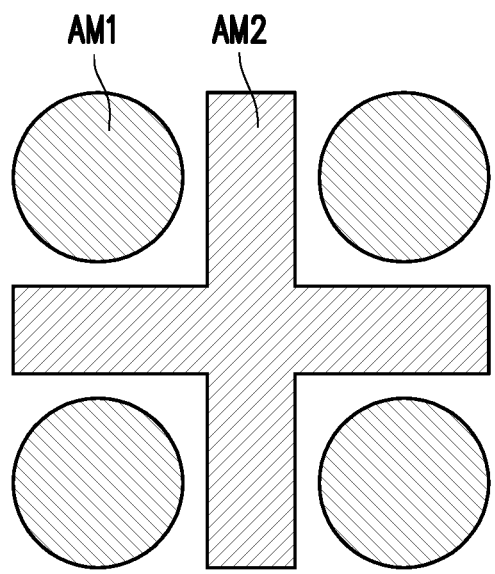

In some embodiments, as shown in FIG. 7, the first alignment mark AM1 is designed to have four round patterns, the second alignment mark AM2 is designed to have a cross-shaped pattern, and the round patterns of the first alignment mark AM1 are around the cross-shaped pattern of the second alignment mark AM2 when the first and second alignment marks are aligned.

Figure 8:
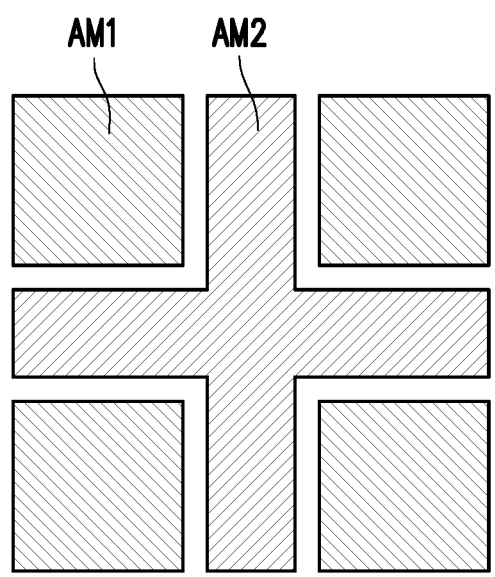

In some embodiments, as shown in FIG. 8, the first alignment mark AM1 is designed to have four square patterns, the second alignment mark AM2 is designed to have a cross-shaped pattern, and the square patterns of the first alignment mark AM1 are around the cross-shaped pattern of the second alignment mark AM2 when the first and second alignment marks are aligned.

Figure 9:
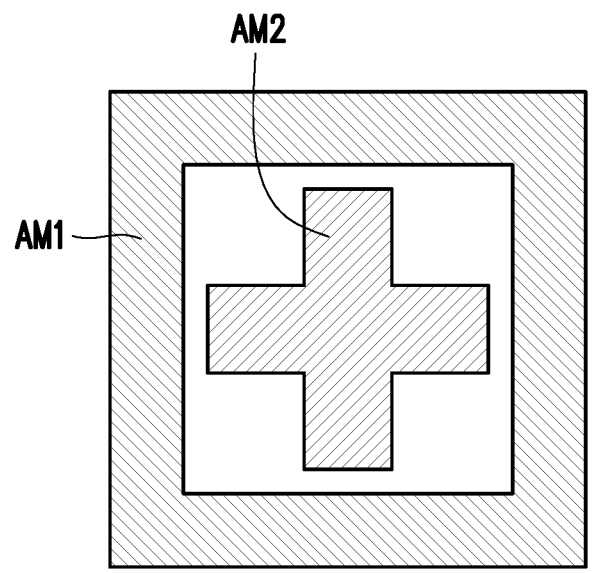

In some embodiments, as shown in FIG. 9, the first alignment mark AM1 is designed to have a box-shaped pattern, the second alignment mark AM2 is designed to have a cross-shaped pattern, and the cross-shaped pattern of the second alignment mark AM2 is within the box-shaped pattern of the first alignment mark AM1 when the first and second alignment marks are aligned.

Figure 10:
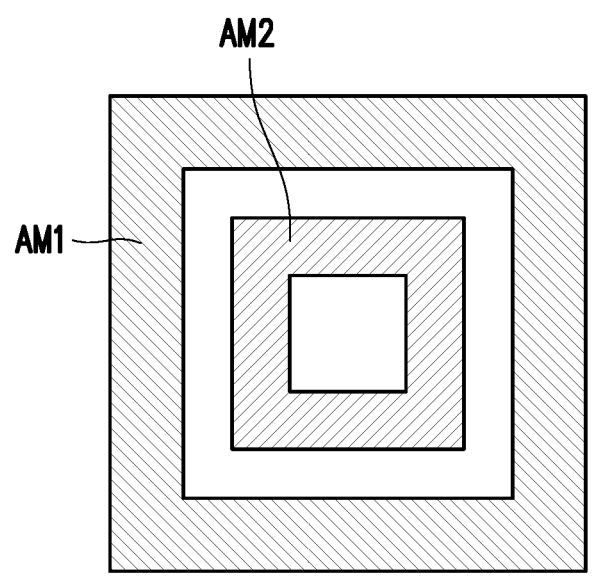
Figure 11:
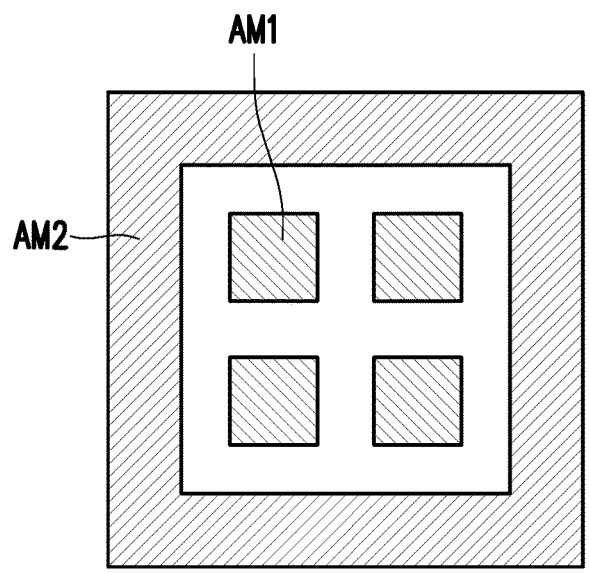
Figure 12:
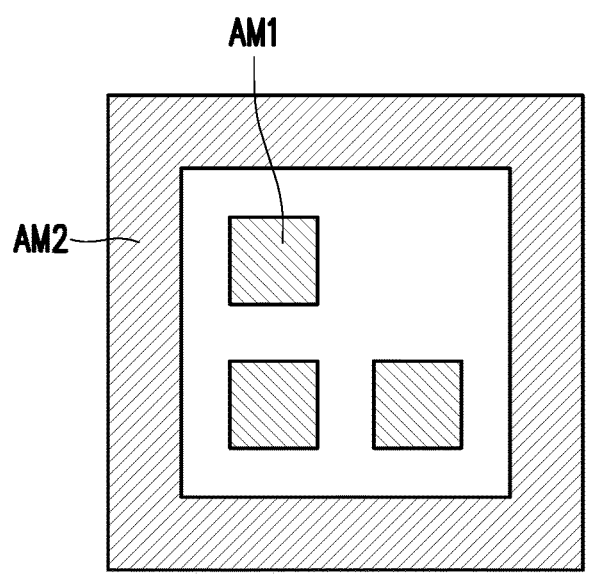
Figure 13:
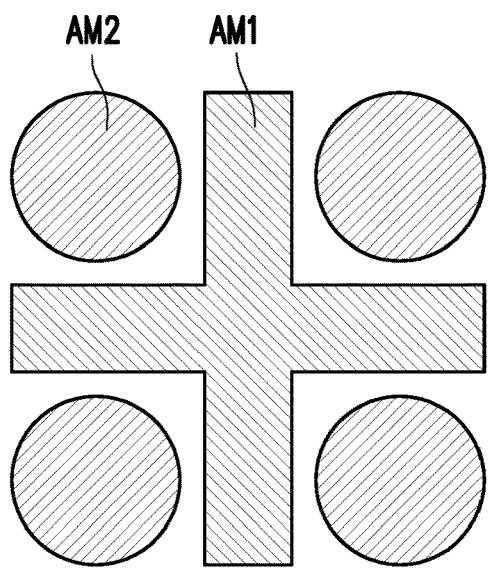
Figure 14:
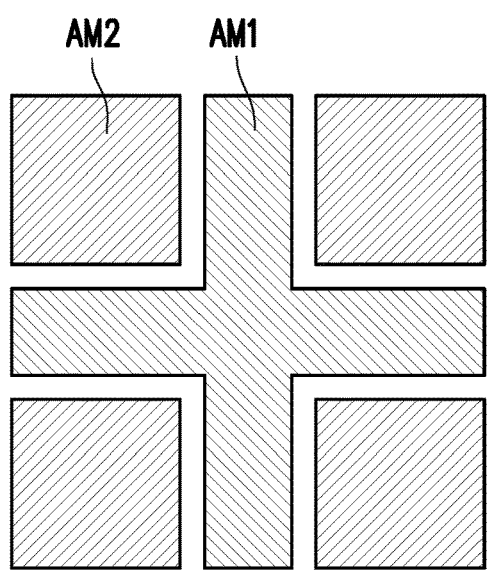
Figure 15:
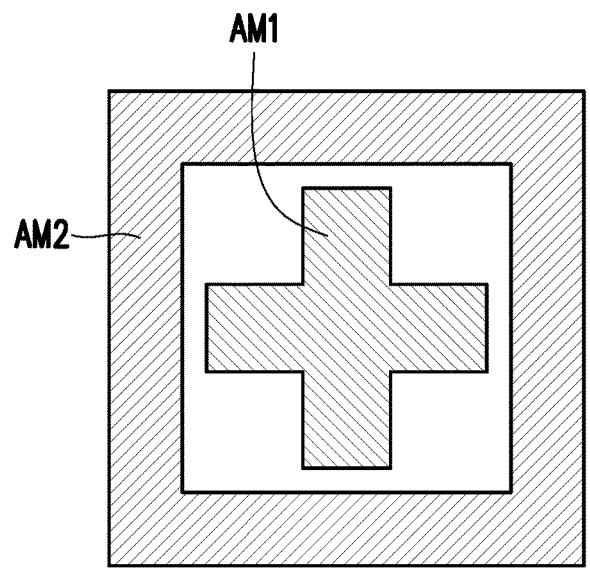
Figure 16:
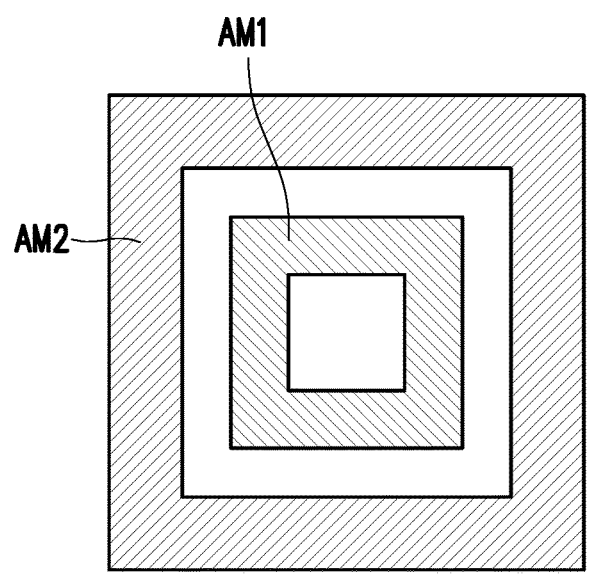

In some embodiments, as shown in FIG. 10, the first alignment mark AM1 is designed to have a box-shaped pattern, the second alignment mark AM2 is designed to have another box-shaped pattern, and the box-shaped pattern of the second alignment mark AM2 is inside of the box-shaped pattern of the first alignment mark AM1 when the first and second alignment marks are aligned.

The above embodiments in which the first alignment mark AM1 is designed for a lower element, device or die and the second alignment mark AM2 is designed for an upper element, device or die are provided for illustration purposes, and are not construed as limiting the present disclosure.

The first and second alignment marks AM1 and AM2 of FIGS. 5-10 can be exchanged. Specifically, in some embodiments, the first alignment mark AM1 can be designed for an upper element, device or die, and the second alignment mark AM2 can be designed for a lower element, device or die, as shown in FIGS. 11-16.

In some embodiments, as shown in FIG. 1, the 3DIC structure 1 includes a first die 100 and a second die 200 bonded to the first die 100. The first die 100 includes a first integrated circuit region 10 and a first seal ring region 12 around the first integrated circuit region 10, and has a first alignment mark AM1 within the first integrated circuit region 10. The second die 200 includes a second integrated circuit region 20 and a second seal ring region 22 around the second integrated circuit region 20, and has a second alignment mark AM2 within the second seal ring region 22 and corresponding to the first alignment mark AM1.

In some embodiments, the first alignment mark AM1 is within the second seal ring region 22 from a top view. In some embodiments, the first die 100 further has a plurality of first seal ring patterns SP1 within the first seal ring region 12 and outside of the second seal ring region 22 from a top view. In some embodiments, the second die 200 further has a plurality of second seal ring patterns SP2 within the second seal ring region 22 and surrounding the second alignment mark AM2. In some embodiments, the second seal ring patterns SP2 of the second die 200 fall within the first die 100 from a top view. In some embodiments, the first die 100 further has a first interconnect structure 104, and a first top metal feature 108a/108b of the first interconnect structure 104 is at a level substantially the same as that of the first alignment mark AM1. In some embodiments, the second die 200 further has a second interconnect structure 204, and a second top metal feature 208a of the second interconnect structure 204 is at a level substantially the same as that of the second alignment mark AM2. In some embodiments, each of the first alignment mark AM1 and the second alignment mark AM2 is square, rectangular, polygonal, round, elliptical, strip-shaped, T-shaped, L-shaped, box-shaped or cross-shaped. In some embodiments, the second die 200 is bonded to the first die 100 through a hybrid bonding including a metal-to-metal bonding and a dielectric-to-dielectric bonding.

In some embodiments, as shown in FIG. 1, the 3DIC structure 1 includes a first die 100 and a second die 200. The first die 100 includes a first semiconductor substrate 102, a first interconnect structure 104 over the first semiconductor substrate 102, a first alignment mark AM1 over the first semiconductor substrate 102 and aside the first interconnect structure 104, and a first bonding structure BS1 over the first interconnect structure 104 and the first alignment mark AM1. The second die 200 includes a second semiconductor substrate 202, a second interconnect structure 204 over the second semiconductor substrate 202, a second alignment mark AM2 over the second semiconductor substrate 202 and aside the second interconnect structure 204, and a second bonding structure BS2 over the second interconnect structure 204 and the second alignment mark AM2. The first die 100 is bonded to the second die 200 with the first bonding structure BS1 and the second bonding structure BS2. The second die 200 further includes second seal ring patterns SP2 aside the second interconnect structure 204 and surrounding the second alignment mark AM2.

In some embodiments, the first alignment mark AM1 and the second alignment mark AM2 are within a corner of a second seal ring region 22 of the second die 200 from a top view. In some embodiments, the 3DIC structure 1 further includes a plurality of through dielectric vias TDV over the first die 100 and surrounding the second die 200. In some embodiments, the 3DIC structure 1 further includes a redistribution layer structure 302 over the second die 200 and electrically connected to the plurality of through dielectric vias TDV. In some embodiments, a first bonding pad BP1 of the first bonding structure BS1 is bonded to a second bonding pad BP2 of the second bonding structure BS2, and a first bonding dielectric layer BDL1 of the first bonding structure BS1 is bonded to a second bonding dielectric layer BDL2 of the second bonding structure BS2.

In the above embodiments, two alignment marks (or called overlay marks) are required for two elements, devices or dies for inspecting the overlay accuracy between the two elements, devices or dies. However, the present disclosure is not limited thereto. In alternative embodiments, only one alignment mark (or called overlay mark) is required for two elements, devices or dies for inspecting the overlay accuracy between the two elements, devices or dies.

Figure 17:
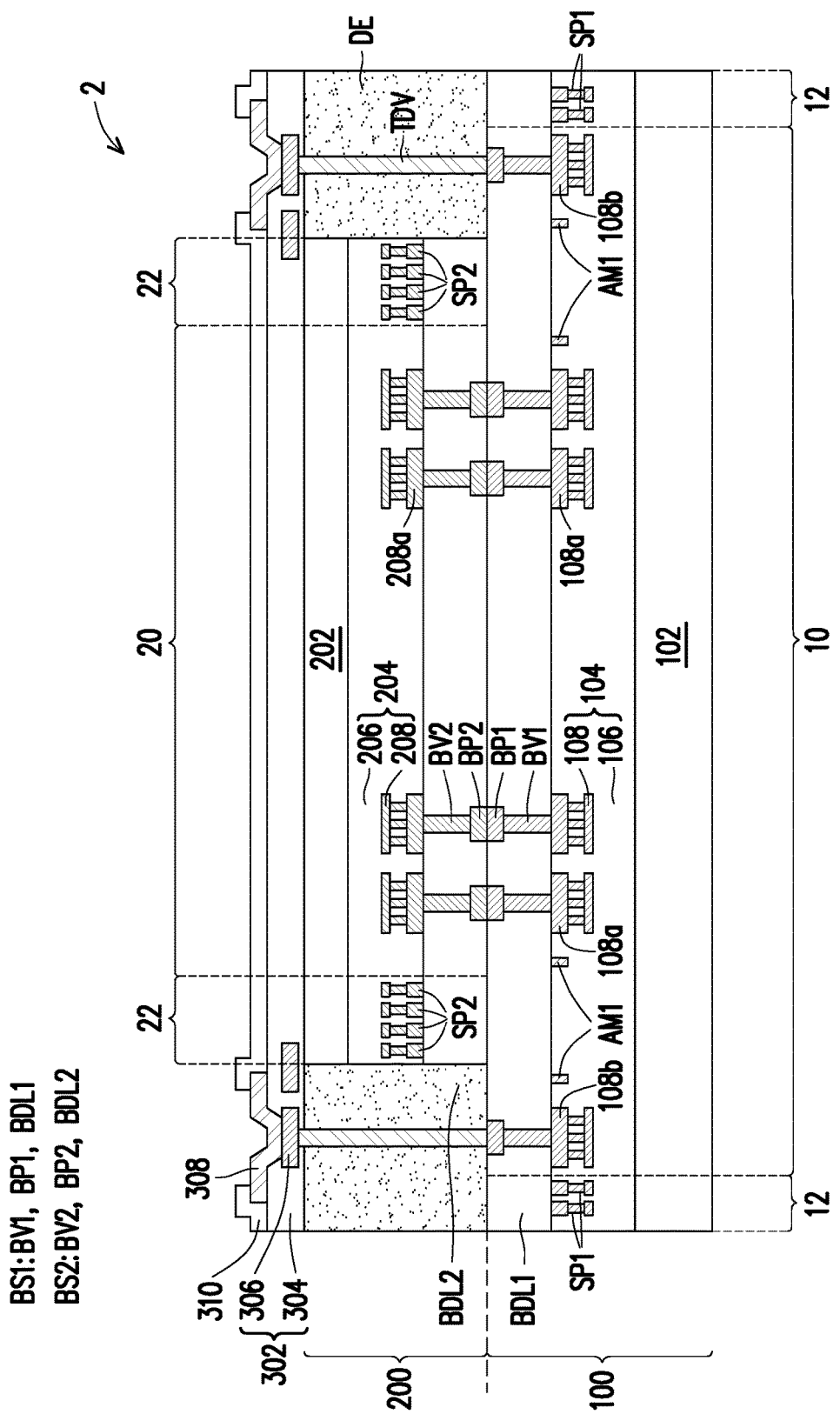
FIG. 17 is a cross-sectional view of a 3DIC structure in accordance with alternative embodiments.
Figure 18:
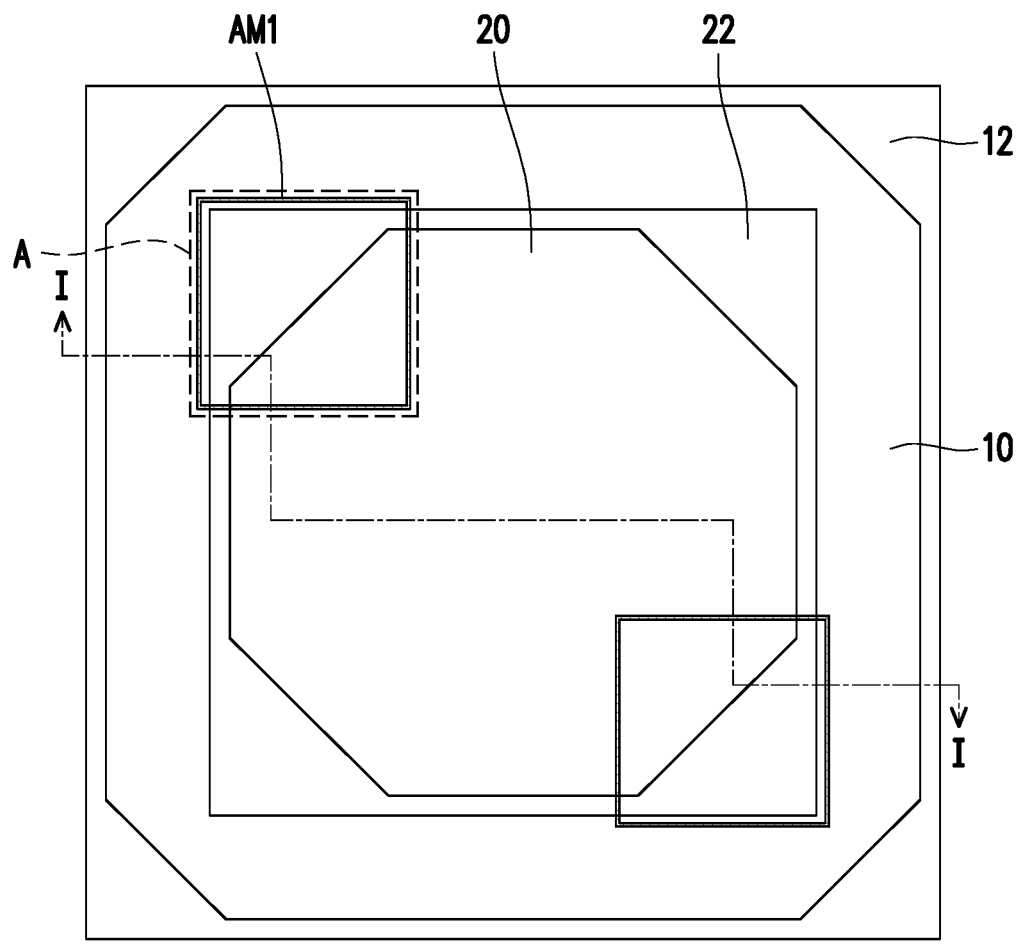
FIG. 18 is a simplified top view of a 3DIC structure in accordance with alternative embodiments.
Figure 19:
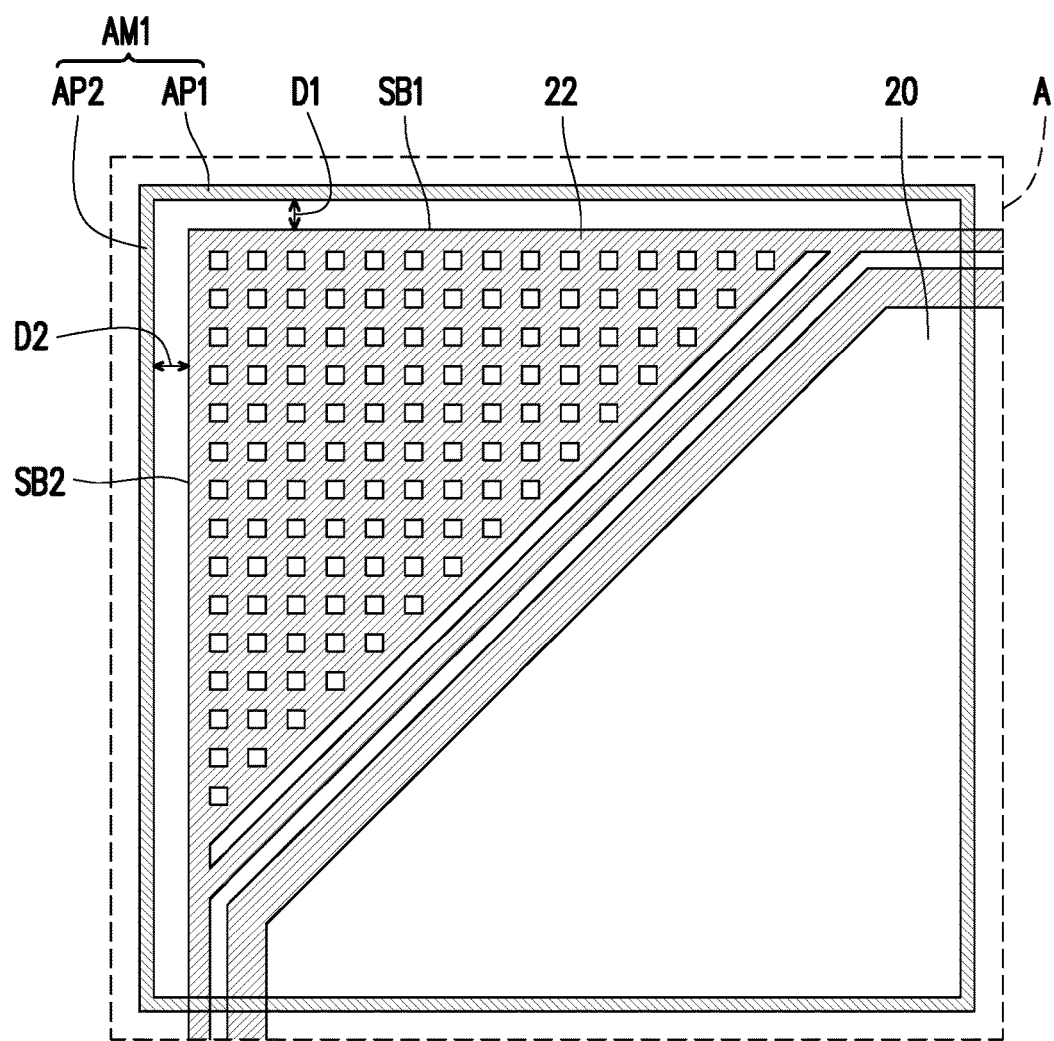
FIG. 19 is an enlarged top view of the part A of FIG. 18.

FIG. 17 is a cross-sectional view of a 3DIC structure in accordance with alternative embodiments. FIG. 18 is a simplified top view of a 3DIC structure in accordance with alternative embodiments. Specifically, FIG. 17 is a cross-sectional view taken along the line I-I of FIG. 18. For simplicity and clarity of illustration, only few elements such as first and second dies and first and second alignment marks are shown in the simplified top view of FIG. 18, and these elements are not necessarily in the same plane. FIG. 19 is an enlarged top view of the part A of FIG. 18.

The 3DIC structure 2 of FIG. 17 is similar to the 3DIC structure 1 of FIG. 1. Thus, the difference between the 3DIC structure 2 and the 3DIC structure 1 is illustrated in details below and the similarity between them is not iterated herein.

Referring to FIG. 17, the 3DIC structure 2 includes a first die 100 and a second die 200 bonded to the first die 100. In some embodiments, the second die 200 is bonded to the first die 100 through a hybrid bonding including a metal-to-metal bonding and a dielectric-to-dielectric bonding. The first die 100 includes a first integrated circuit region 10 and a first seal ring region 12 surrounding the first integrated circuit region 10. The second die 200 includes a second integrated circuit region 20 and a second seal ring region 22 surrounding the second integrated circuit region 20.

In some embodiments, the first die 100 has a first alignment mark AM1 within the first integrated circuit region 10. The first alignment mark AM1 is around a corner of the second seal ring region 22 from a top view, as shown in FIG. 18 and FIG. 19. In some embodiments, the first die 100 further has first seal ring patterns SP1 within the first seal ring region 12 around the first alignment mark AM1. In some embodiments, from the top view, part of the first alignment mark AM1 is placed between the first seal ring patterns SP1 and the second seal ring patterns SP2, as shown in FIG. 17.

One difference between the 3DIC structure 2 and the 3DIC structure 1 lies in that, from the top view, the first alignment mark AM1 of the first die 100 in FIG. 17 is outside of the second seal ring region 22, while, the first alignment mark AM1 of the first die 100 in FIG. 1 is within the second seal ring region 22.

In some embodiments, no alignment mark is present within the corner of the second seal ring region 22, as shown in FIG. 18 and FIG. 19. Specifically, only second seal sing patterns SP2 are configured in the corner of the second seal ring region 22 of the second die 200.

Another difference between the 3DIC structure 2 and the 3DIC structure 1 lies in that, the second alignment mark AM2 of the second die 200 is configured for the 3DIC structure 1 in FIG. 1, while no such element is configured for the 3DIC structure 2 in FIG. 17. Instead, the seal ring border of the second seal ring region 22 functions as the second alignment mark for the second die 200 of the 3DIC structure 2 in FIG. 17.

In some embodiments, the first alignment mark AM1 is square, rectangular, polygonal, strip-shaped, T-shaped, L-shaped, box-shaped, cross-shaped or any suitable shape. For example, the first alignment mark AM1 is designed as a square box, as shown in FIG. 17 and FIG. 18.

Figure 20:
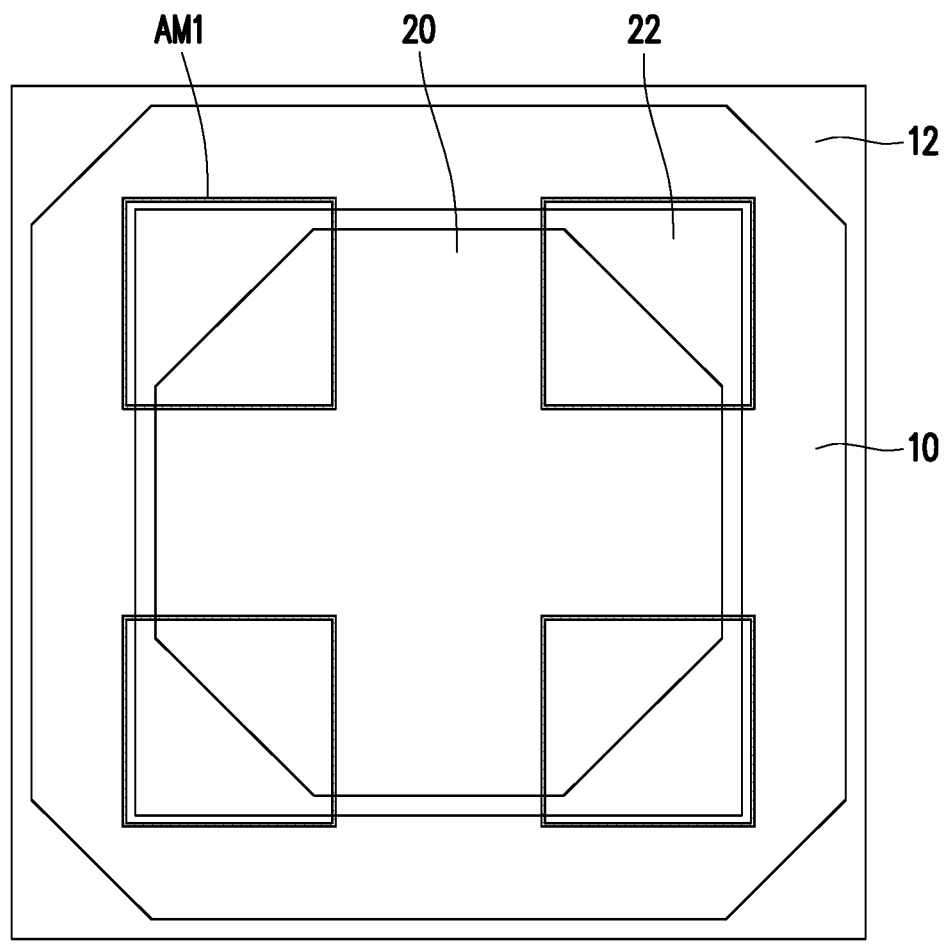
FIG. 20 is a simplified top view of a 3DIC structure in accordance with alternative embodiments.

In some embodiments, multiple first alignment marks AM1 are disposed in the first integrated circuit region 10. In some embodiments, two first alignment marks AM1 are disposed around the diagonal corners of the second seal ring region 22, as shown in FIG. 18. In alternative embodiments, four first alignment marks AM1 are disposed around the four corners of the second seal ring region 22, as shown in FIG. 20.

In some embodiments, the first alignment mark AM1 includes a first alignment pattern AP1 parallel to a first border SB1 of the second seal ring region 22, and a second alignment pattern AP2 parallel to a second border SB2 of the second seal ring region 22, as shown in FIG. 19. In some embodiments, the first distance (e.g., vertical distance) D1 between the first alignment pattern AP1 of the first alignment mark AM1 and the first border SB1 of the second seal ring region 22 is from about 2 µm to about 10 µm, and the second distance (e.g., horizontal distance) D2 between the second alignment pattern AP2 of the first alignment mark AM1 and the second border SB2 of the second seal ring region 22 is from about 2 µm to about 10 µm.

In some embodiments, the first alignment pattern AP1 and the second alignment pattern AP2 of the first alignment mark AM1 are connected to each other. In alternative embodiments, the first alignment pattern AP1 and the second alignment pattern AP2 of the first alignment mark AM1 can be separated from one another.

In some embodiments, the first alignment mark AM1 is designed as a square box, and the first alignment mark AM1 of the first die 100 is partially overlapped with the second seal ring patterns SP2 of the second die 200 from a top view, as shown in FIGS. 17-20.

Figure 21:
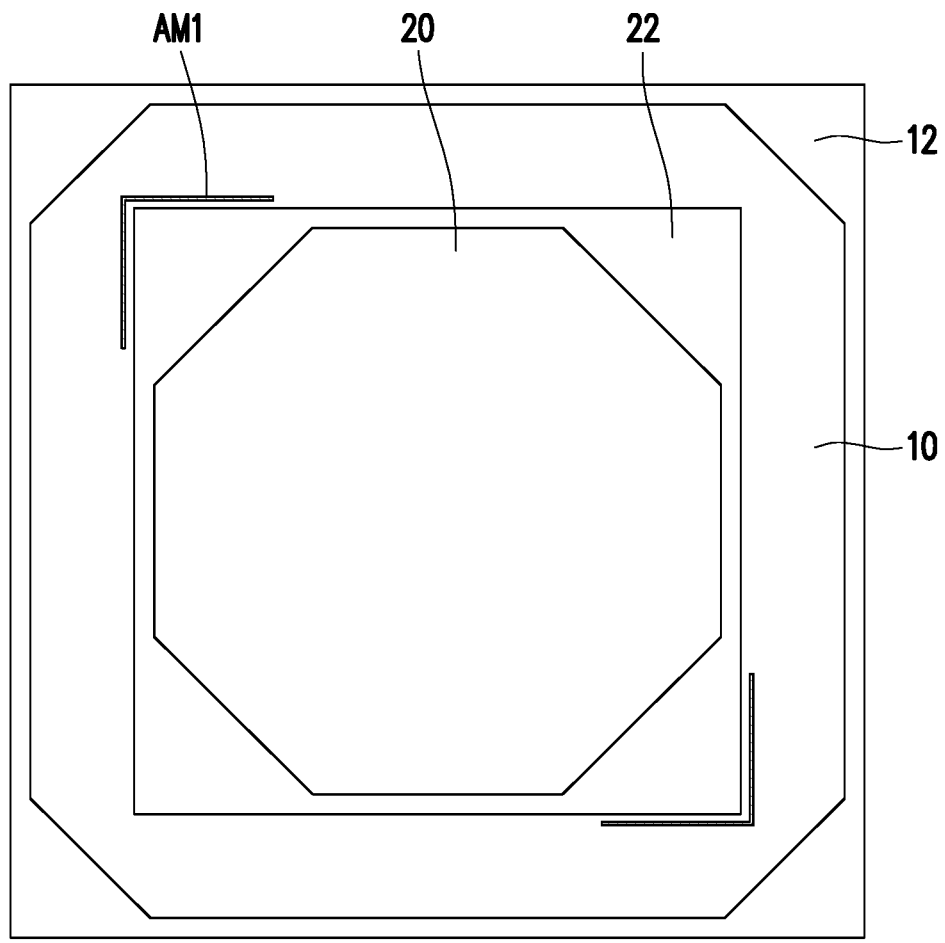
FIG. 21 to FIG. 22 are simplified top views of 3DIC structures in accordance with yet alternative embodiments.
Figure 22:
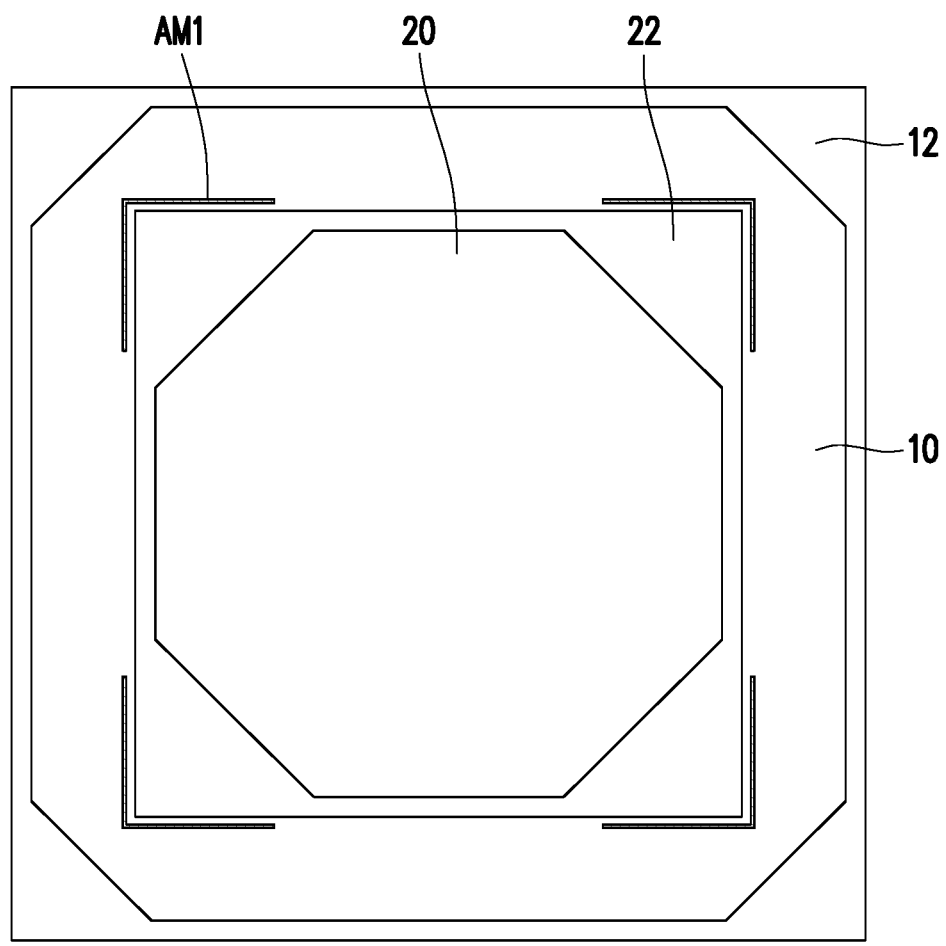

In alternative embodiments, the first alignment mark AM1 is designed to have an L-shape, and the first alignment mark AM1 of the first die 100 is not overlapped with the second seal ring patterns SP2 of the second die 200 from a top view, as shown in FIGS. 21-22.

In the application, the alignment marks of a 3DIC structure are configured in a space-saving manner. Specifically, in the conventional die stack structure, two alignment marks are placed in the integrated circuit regions of two bonded dies, so the available chip areas are reduced. On the contrary, in the application, in some embodiments, two alignment marks of two bonded dies are placed in at least one corner of the seal ring region of one die, without reducing the available chip areas. In alternative embodiments, only one alignment mark is place around at least one corner of the seal ring region of one die of the bonded structure, and thus, not only the chip area is saved but also the layout design is simplified.

In view of the above, an improved die-to-die alignment technique as herein provided takes advantage of forming alignment marks (or overlay marks) within or around a seal ring region of one die. By providing alignment marks (or overlay marks) within or around a seal ring region of one die, the die-to-die alignment can be improved without reducing the available chip areas. Many variations of the above examples are contemplated by the present disclosure. It is understood that different embodiments may have different advantages, and that no particular advantage is necessarily required of all embodiments.

In accordance with some embodiments of the present disclosure, a 3DIC structure includes a first die and a second die bonded to the first die. The first die includes a first integrated circuit region and a first seal ring region around the first integrated circuit region, and has a first alignment mark within the first integrated circuit region. The second die includes a second integrated circuit region and a second seal ring region around the second integrated circuit region, and has a second alignment mark within the second seal ring region and corresponding to the first alignment mark.

In accordance with alternative embodiments of the present disclosure, a 3DIC structure includes a first die and a second die bonded to the first die. The first die includes a first integrated circuit region and a first seal ring region surrounding the first integrated circuit region, and has a first alignment mark within the first integrated circuit region. The second die includes a second integrated circuit region and a second seal ring region surrounding the second integrated circuit region. The first alignment mark is around a corner of the second seal ring region from a top view.

In accordance with yet alternative embodiments of the present disclosure, a 3DIC structure includes a first die and a second die. The first die includes a first semiconductor substrate, a first interconnect structure over the first semiconductor substrate, a first alignment mark over the first semiconductor substrate and aside the first interconnect structure, and a first bonding structure over the first interconnect structure and the first alignment mark. The second die includes a second semiconductor substrate, a second interconnect structure over the second semiconductor substrate, a second alignment mark over the second semiconductor substrate and aside the second interconnect structure, and a second bonding structure over the second interconnect structure and the second alignment mark. The first die is bonded to the second die with the first bonding structure and the second bonding structure. The second die further includes seal ring patterns aside the second interconnect structure and surrounding the second alignment mark.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional integrated circuit structure, comprising:
    a first die comprising a first integrated circuit region, a first seal ring region around the first integrated circuit region, and a first alignment mark within the first integrated circuit region; and
    a second die bonded to the first die, comprising a second integrated circuit region, a second seal ring region around the second integrated circuit region, and a second alignment mark within the second seal ring region and corresponding to the first alignment mark, wherein the first die further comprises a plurality of first seal ring patterns within the first seal ring region and outside of the second seal ring region from a top view.

2. The three-dimensional integrated circuit structure of claim 1, wherein the first alignment mark is within the second seal ring region from a top view.

3. The three-dimensional integrated circuit structure of claim 1, wherein the second die further comprises a plurality of second seal ring patterns within the second seal ring region and surrounding the second alignment mark.

4. The three-dimensional integrated circuit structure of claim 1, wherein the first die further has a first interconnect structure, and a first top metal feature of the first interconnect structure is at a level substantially the same as that of the first alignment mark.

5. The three-dimensional integrated circuit structure of claim 1, wherein the second die further has a second interconnect structure, and a second top metal feature of the second interconnect structure is at a level substantially the same as that of the second alignment mark.

6. The three-dimensional integrated circuit structure of claim 1, wherein each of the first alignment mark and the second alignment mark is square, rectangular, polygonal, round, elliptical, strip-shaped, T-shaped, L-shaped, box-shaped or cross-shaped.

7. The three-dimensional integrated circuit structure of claim 1, wherein the second die is bonded to the first die through a hybrid bonding comprising a metal-to-metal bonding and a dielectric-to-dielectric bonding.

8. The three-dimensional integrated circuit structure of claim 3, wherein the first alignment mark and the first seal ring patterns are at substantially the same level.

9. The three-dimensional integrated circuit structure of claim 3, wherein the second alignment mark and the second seal ring patterns are at substantially the same level.

10. The three-dimensional integrated circuit structure of claim 1, wherein the first die further comprises a first semiconductor substrate, a first interconnect structure over the first semiconductor substrate, and the first alignment mark is over the first semiconductor substrate and aside the first interconnect structure.

11. The three-dimensional integrated circuit structure of claim 10, wherein the first die further comprises a first bonding structure over the first interconnect structure, and the first bonding structure comprises a plurality of first bonding features embedded by at least one first bonding dielectric layer.

12. The three-dimensional integrated circuit structure of claim 1, wherein the second die further comprises a second semiconductor substrate, a second interconnect structure over the second semiconductor substrate, and the second alignment mark is over the second semiconductor substrate and aside the second interconnect structure.

13. The three-dimensional integrated circuit structure of claim 12, wherein the second die further comprises a second bonding structure over the second interconnect structure, and the second bonding structure comprises a plurality of second bonding features embedded by at least one second bonding dielectric layer.

14. The three-dimensional integrated circuit structure of claim 1, wherein the first alignment mark and the second alignment mark are within a corner of the second seal ring region of the second die from a top view.

15. The three-dimensional integrated circuit structure of claim 1, further comprising a plurality of through dielectric vias over the first die and surrounding the second die.

16. The three-dimensional integrated circuit structure of claim 15, further comprising a redistribution layer structure over the second die and electrically connected to the plurality of through dielectric vias.

17. The three-dimensional integrated circuit structure of claim 1, wherein from a top view, the first alignment mark comprises a shape complementary of a shape of the second alignment mark.

18. A three-dimensional integrated circuit structure, comprising:
    a first die comprising a first integrated circuit region, a first seal ring region around the first integrated circuit region, and a first alignment mark within the first integrated circuit region; and
    a second die bonded to the first die, comprising a second integrated circuit region, a second seal ring region around the second integrated circuit region, and a second alignment mark within the second seal ring region and corresponding to the first alignment mark, wherein the first alignment mark is between metal features of a first interconnect structure of the first die, and the second alignment mark is outside of metal features of a second interconnect structure of the second die.

19. A three-dimensional integrated circuit structure, comprising:
- a first die comprising a first integrated circuit region, a first seal ring region around the first integrated circuit region, and a first alignment mark within the first integrated circuit region;
- a second die bonded to the first die, comprising a second integrated circuit region, a second seal ring region around the second integrated circuit region, and a second alignment mark within the second seal ring region and corresponding to the first alignment mark; and
- a plurality of through dielectric vias over the first die and surrounding the second die,
- wherein the first die further comprises a plurality of first seal ring patterns at an outer side of the through dielectric vias.

* * * * *